(12) United States Patent
Shiobara

(10) Patent No.: US 11,366,380 B2
(45) Date of Patent: Jun. 21, 2022

(54) REFLECTIVE MASK

(71) Applicant: KIOXIA CORPORATION, Tokyo (JP)

(72) Inventor: Eishi Shiobara, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 102 days.

(21) Appl. No.: 17/003,929

(22) Filed: Aug. 26, 2020

(65) Prior Publication Data

US 2021/0072634 A1 Mar. 11, 2021

(30) Foreign Application Priority Data

Sep. 10, 2019 (JP) .............................. JP2019-164085

(51) Int. Cl.
*G03F 1/24* (2012.01)
(52) U.S. Cl.
CPC ...................... *G03F 1/24* (2013.01)
(58) Field of Classification Search
CPC ....................................................... G03F 1/24
USPC ............................................................ 430/5
See application file for complete search history.

(56) References Cited

U.S. PATENT DOCUMENTS

| 8,372,564 | B2 | 2/2013 | Shoki |
| 2011/0287344 | A1 | 11/2011 | Irie |
| 2014/0127613 | A1 | 5/2014 | Kagawa |
| 2019/0086792 | A1 | 3/2019 | Kamo et al. |

FOREIGN PATENT DOCUMENTS

| JP | H11305417 A | 11/1999 |
| JP | H11352669 A | 12/1999 |
| JP | 2011222612 A | 11/2011 |
| JP | 2014096397 A | 5/2014 |
| JP | 2014096483 A | 5/2014 |
| JP | 2016012598 A | 1/2016 |
| JP | 2019053229 A | 4/2019 |

*Primary Examiner* — Christopher G Young
(74) *Attorney, Agent, or Firm* — Kim & Stewart LLP

(57) ABSTRACT

According to one embodiment, a reflective mask comprises a reflection layer including a first region having a plurality of first patterns, a second region surrounding the first region, and a third region within the second region. The reflection layer includes a stack of alternating first layers and second layers. An absorber film covers the second region and has a second pattern that includes an opening exposing a portion of the third region. In some examples, the third region can include a plurality of third patterns therein.

20 Claims, 10 Drawing Sheets

REFLECTIVE MASK

CROSS-REFERENCE TO RELATED APPLICATION(S)

This application is based upon and claims the benefit of priority from Japanese Patent Application No. 2019-164085, filed Sep. 10, 2019, the entire contents of which are incorporated herein by reference.

FIELD

Embodiments described herein relate generally to a reflective mask.

BACKGROUND

An exposure apparatus which is compatible with use of short-wavelength exposure light, such as extreme ultraviolet (EUV) light, is typically configured to use a reflective mask to expose a substrate to the exposure light. In this situation, improving throughput of exposure processing is desired.

DETAILED DESCRIPTION

Figure 1:
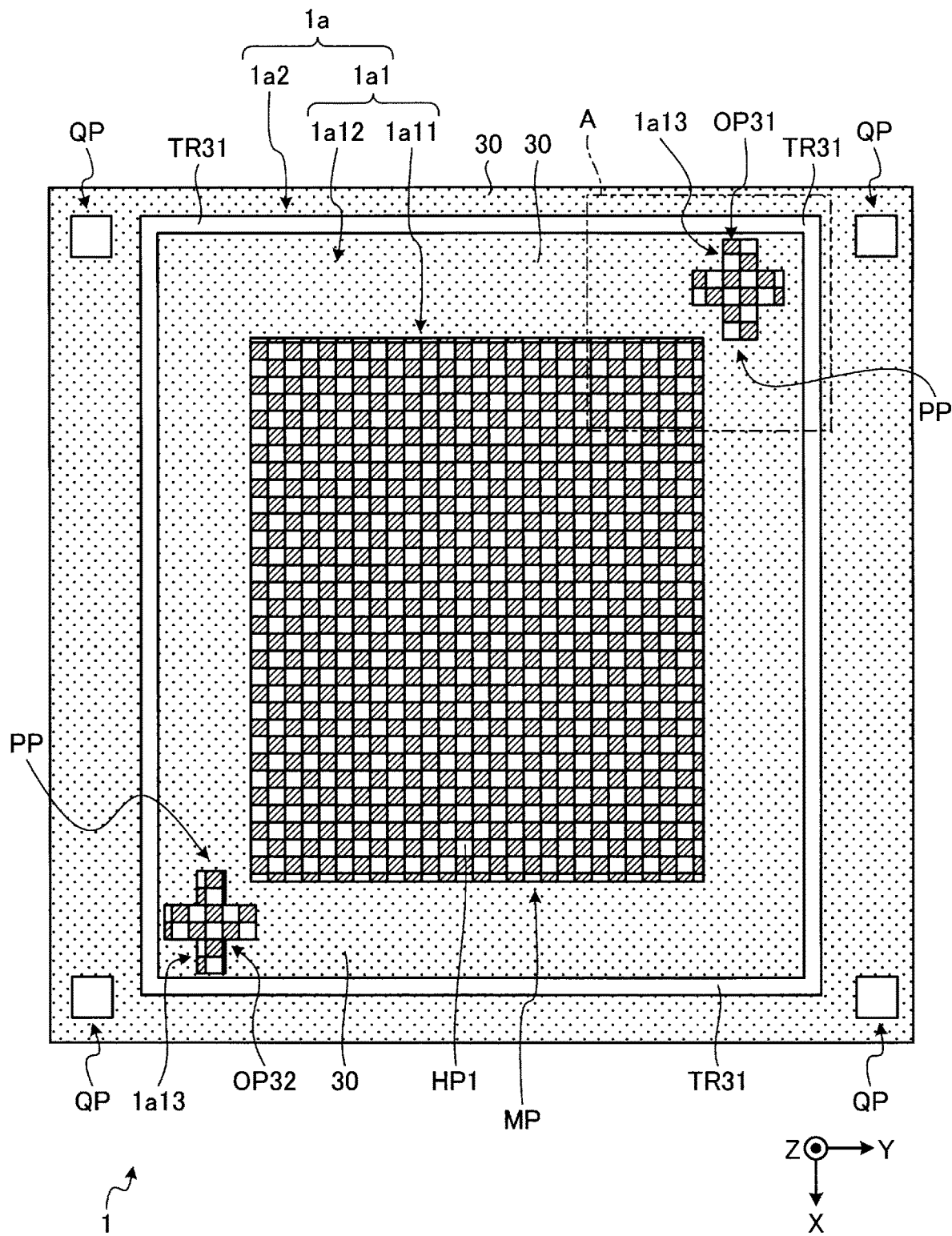
FIG. 1 is a plan view illustrating a configuration of a reflective mask according to a first embodiment.

Embodiments provide a reflective mask adapted to improve throughput of exposure processing.

In general, according to one embodiment, a reflective mask comprises a multi-layer reflection layer including a first region having a plurality of first patterns, a second region surrounding the first region, and a third region within the second region. The reflection layer includes a stack of alternating first layers and second layers. An absorber film covers the second region and has a second pattern formed therein that includes an opening exposing a portion of the third region. In some examples, the third region can include a plurality of third patterns therein.

Hereinafter, reflective masks according to certain example embodiments will be described in detail with reference to the accompanying drawings. These examples do not limit the present disclosure.

First Embodiment

A reflective mask according to a first embodiment is used for a lithography process in semiconductor device manufacturing. To cope with miniaturization of patterns in semiconductor device manufacturing, extreme ultraviolet lithography (EUVL) technology is considered to be about ready to be put to practical use. In an EUVL process, a reflective mask having a pattern formed with a multi-layer reflective layer provided on a substrate may be used.

In the EUVL process, to compensate for insufficiency of power from EUV light sources, it is required to make photoresists highly sensitive to the available output from the EUV light sources. With a contact hole pattern, the requisite exposure dose is known to increase as compared with a line and space pattern. Therefore, achieving a higher power EUV light source, improving the resist material, and optimizing the available illumination for pattern exposure are all currently being pursued. In response to this, various measures such as achieving a high-power light source, making a resist more sensitive and less defective, optimizing illumination for use in an exposure apparatus, and employing an EUV phase shift mask are conceivable.

For example, providing a reflective mask with phase shift performance by making a plurality of engraved structures in a multi-layer reflection layer is considered. In this multi-layer reflection layer, a plurality of engraved structures is repetitively provided at intervals equivalent to the planar dimension of each engraved structure according to a desired pattern to be formed. When the reflective mask is irradiated with exposure light (for example, EUV light), light reflected from the surface of a portion having no engraved structure and light reflected from the bottom surface of an engraved structure become approximately opposite in phase. Accordingly, the exposure pattern which is transferred to a substrate has portions corresponding to the boundary of each engraved structure which can serve as a dark portion in a contrast image of light and dark portions.

Thus, using a reflective mask having a phase shift function is expected to enable making an exposure pattern for contact holes using lower exposure doses (for example, a reduction of seven times) and making the contrast higher as compared with using a reflective mask having no phase shift function.

However, when a reflective mask is made to have a phase shift function, although a fine pattern which is formed in a device region can made with lower exposure doses, a peripheral pattern (large in size) which is formed in a peripheral region may receive an insufficient exposure dose if the dose is set only as appropriate for the device region's fine patterns. The fine pattern is, for example, a contact hole pattern, and the peripheral pattern is, for example, an alignment mark. The features of the peripheral pattern are substantially larger in dimension than those of the fine pattern. Accordingly, if the device region and the peripheral region are both to be exposed with an exposure dose appropriate for the device region, then the exposure dose for the peripheral region is likely to be insufficient if the device region is not to be overexposed. Thus, there is a possibility that it may be impossible to simultaneously form a fine pattern in the device region and a peripheral pattern in the peripheral region. But, if the device region and the peripheral region must be separately exposed, then the number of exposure processes increases, so that there is a possibility that throughput of exposure processing using a reflective mask decreases.

Therefore, with regard to a reflective mask, the present embodiment configures a multi-layer reflection layer in such a manner that the appropriate exposure dose for the device region and the appropriate exposure dose for the peripheral region become equivalent to each other, thus enabling batch (simultaneous) exposure for the device region and the peripheral region while still providing the reflective mask with a phase shift function.

Specifically, the reflective mask is provided with a device region and a peripheral region, and the peripheral region is covered with an absorber film. In the device region, two types of multi-layer film structures (different in the number of layers thereof) are alternately arranged in a repetitive manner in planar direction according to a fine pattern to be formed (for example, a hole pattern), so that a multi-layer reflection layer having a phase shift effect is configured. In the peripheral region, an opening is provided in the absorber film according to a peripheral pattern to be formed (for example, an alignment mark pattern).

The peripheral pattern is larger in planar area than the fine pattern. The peripheral pattern, which is formed in a region exposed by the opening in the absorber, is configured with an aggregate of patterns similar to the fine pattern. Thus, even in the region exposed at the opening, two types of multi-layer film structures (different in the number of layers thereof) are alternately arranged in a repetitive manner, so that a multi-layer reflection layer having a phase shift effect is configured in both regions. This configuration enables making the exposure dose that is appropriate for the device region and the exposure dose that is appropriate for the peripheral region basically equal to each other in an exposure process using a reflective mask.

In other words, this configuration enables forming a fine pattern and a peripheral pattern, which is something other than the fine pattern, with use of approximately the same exposure dose. Accordingly, along with a reflected light intensity being increased by the phase shift effect, a batch (simultaneous) exposure process for the fine pattern and the peripheral pattern can be utilized. This improves throughput of exposure processing of a substrate using a reflective mask while reducing the required exposure does and making the aerial image contrast higher.

More specifically, a reflective mask 1 is configured as illustrated in FIG. 1. FIG. 1 is a plan view illustrating a configuration of the reflective mask 1. Furthermore, while, in the following description, the reflective mask 1 for EUV is described as an example, the reflective mask 1 according to the present embodiment is not limited to a reflective mask for EUV but is also applicable to reflective masks for other types of exposure light.

Figure 3:
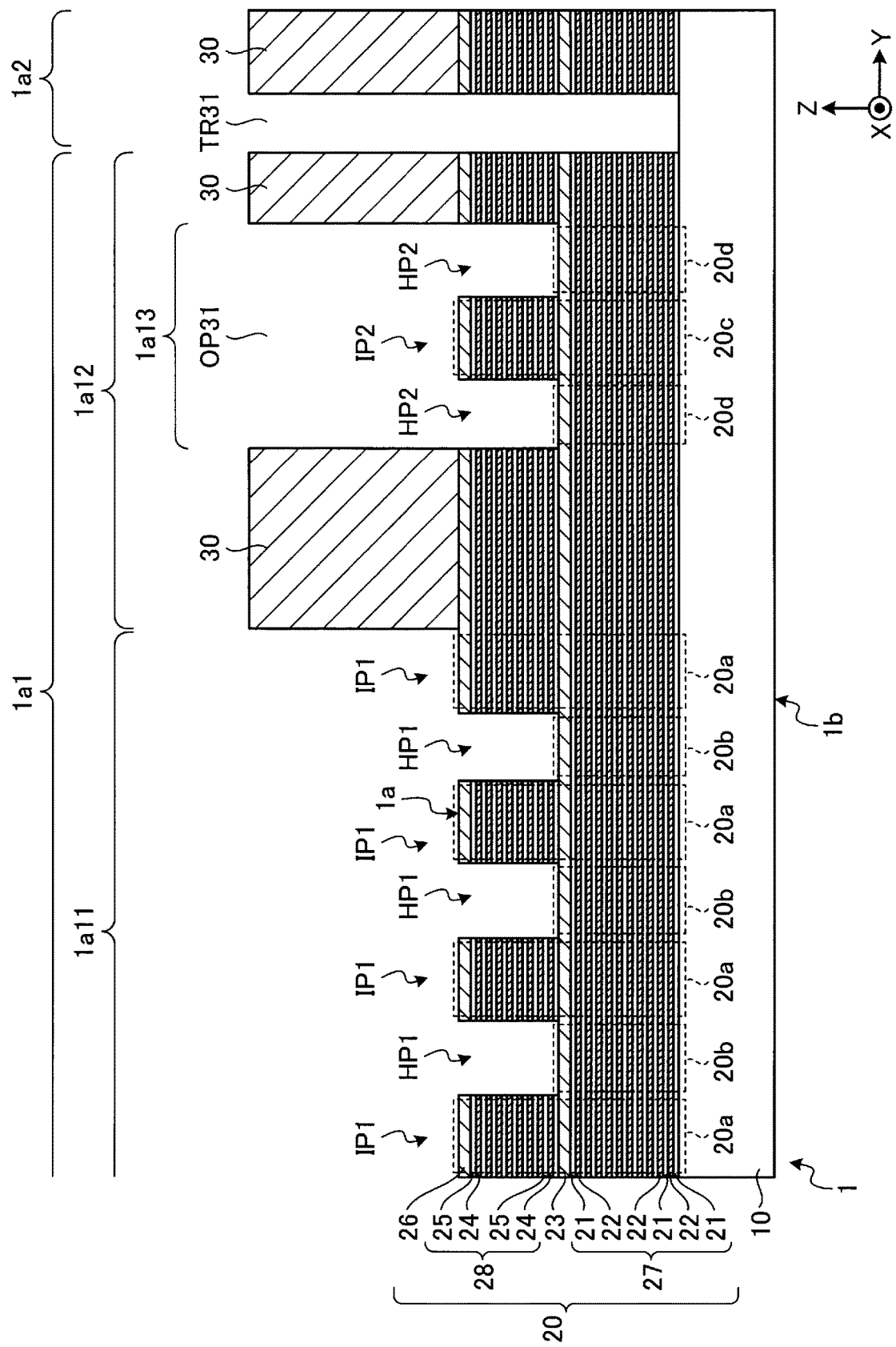
FIG. 3 is an enlarged cross-sectional view illustrating the configuration of a reflective mask according to a first embodiment.

The reflective mask 1 has a pattern surface 1a and a rear surface 1b (see FIG. 3). In the following description, a direction perpendicular to the pattern surface 1a is referred to as a "Z-direction", and two directions perpendicular to each other in a plane orthogonal to the Z-direction are referred to as an "X-direction" and a "Y-direction". The reflective mask 1 has an approximately rectangular shape having edges along the X-direction and edges along the Y-direction in XY plane view.

The pattern surface 1a is a surface (referred to as a front surface) which faces a substrate (for example, a wafer) when the reflective mask 1 is being used in an exposure apparatus (not separately illustrated). The pattern surface 1a has a pattern formed thereon. The pattern is to be transferred to the substrate in the exposure apparatus.

The rear surface 1b is a surface opposite to the pattern surface 1a. The rear surface 1b is the surface which is fixed to a mask stage by an electrostatic chuck mechanism or the like when the reflective mask 1 is being used in an exposure apparatus.

The pattern surface 1a includes a transfer region 1a1 and an out-of-transfer region 1a2. The transfer region 1a1 has a pattern located therein that is to be transferred to a substrate targeted for exposure.

The out-of-transfer region 1a2 is a region outside the transfer region 1a1. The out-of-transfer region 1a2 has, for example, patterns QP for quality assurance purposes of the reflective mask 1 located therein.

The transfer region 1a1 includes a device region 1a11 and a peripheral region 1a12. The peripheral region 1a12 is a region located surrounding (or at least outside) the device region 1a11. As depicted in FIG. 1, the peripheral region 1a12 surrounds the device region 1a11 in XY plane view.

On the pattern surface 1a, the peripheral region 1a12 and the out-of-transfer region 1a2 are covered with an absorber film 30. The absorber film 30 prevents, or substantially reduces, exposure light from reflecting off the pattern surface 1a. The absorber film 30 may be formed from a material which contains, as a major component, a substance high in absorbance (in other words, low in reflectance) with respect to exposure light (for example, tantalum (Ta), tantalum nitride (TaN), or boron-containing tantalum oxide (TaBOx)).

The absorber film 30 has openings OP31 and OP32 formed therein. A light-shielding frame TR31 is also formed in absorber film 30. The openings OP31 and OP32 expose parts of the peripheral region 1a12. The light-shielding frame TR31 is in the vicinity of a boundary between the transfer region 1a1 and the out-of-transfer region 1a2. The light-shielding frame TR31 may be formed in a continuous groove-like shape. The peripheral region 1a12 includes therein opening regions 1a13, which are exposed at the openings OP31 and OP32. The light-shielding frame TR31 extends along the boundary between the transfer region 1a1 and the out-of-transfer region 1a2 in XY plane view, and surrounds the transfer region 1a1.

The device region 1a11 has a plurality of fine patterns HP1 located therein. The aggregation of all the fine patterns HP1 may be also referred to as a "main pattern MP". In this context, the fine pattern HP1 may be a pattern having the smallest dimension out of the patterns to be transferred to a substrate targeted for exposure. The fine pattern HP1 may be a contact hole pattern. The opening region 1a13 has peripheral patterns PP located therein. The area of the peripheral pattern PP is larger than the area of a fine pattern HP1. The dimensions of the outer contour of the peripheral pattern PP are larger than the dimensions of the outer contour of the fine pattern HP1. The peripheral pattern PP may be an alignment mark or an overlay mark.

Figure 2:
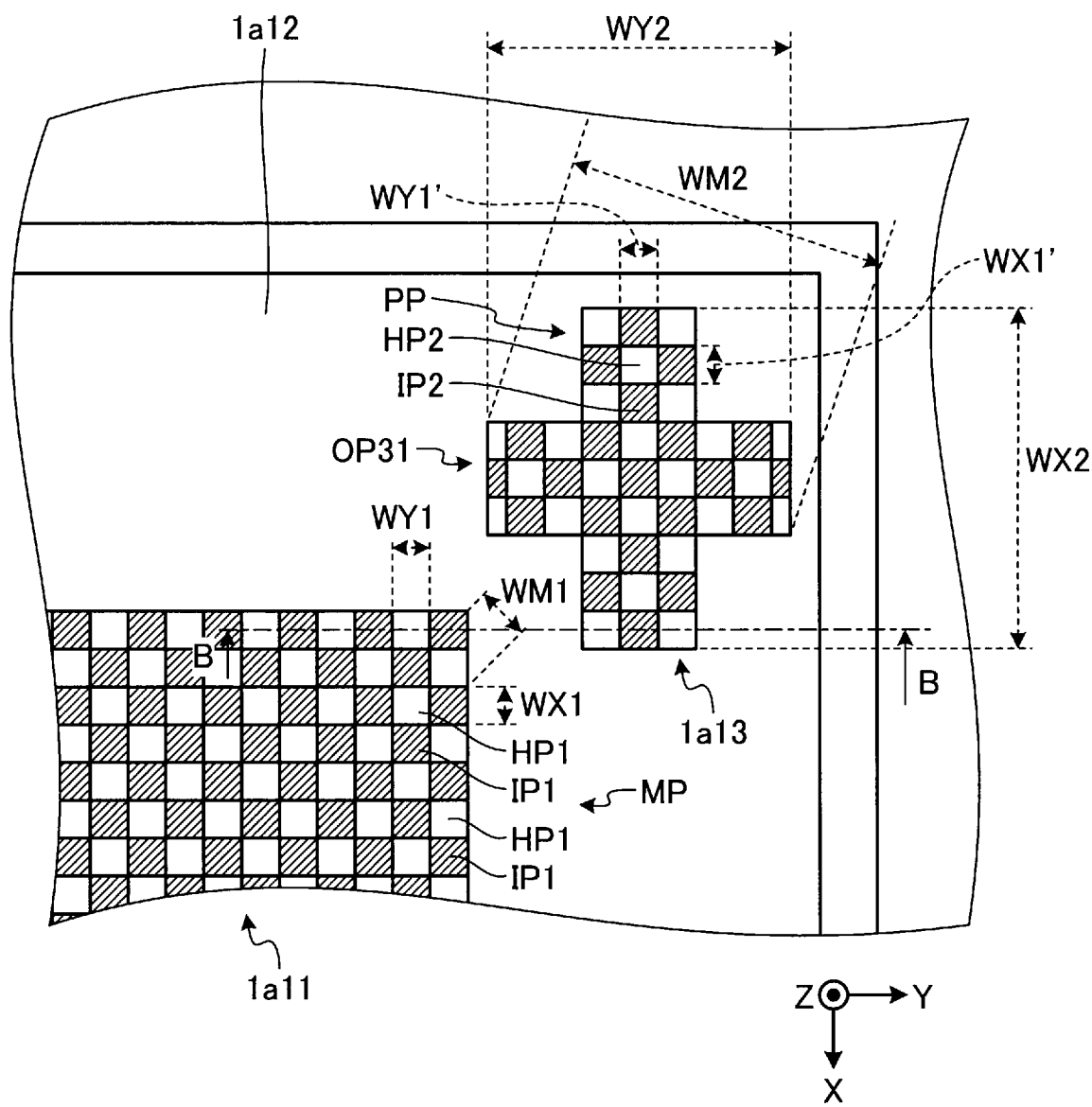
FIG. 2 is an enlarged plan view illustrating the configuration of a reflective mask according to a first embodiment.

For example, as illustrated in FIG. 2, in XY plane view, the fine pattern HP1 may be a hole pattern in the shape of an approximate square and the peripheral pattern PP may be a mark pattern in the shape of an approximate cross. FIG. 2 is an enlarged plan view illustrating the configuration of the reflective mask 1 and is an enlarged plan view obtained by enlarging the portion A illustrated in FIG. 1.

The planar area of the peripheral pattern PP is larger than the planar area of the fine pattern HP1. Likewise, the dimension of the outer contour of the peripheral pattern PP is larger than the dimension of the outer contour of the fine pattern HP1. The X-direction width WX2 of the peripheral pattern PP is larger than the X-direction width WX1 of the fine pattern HP1. The Y-direction width WY2 of the peripheral pattern PP is larger than the Y-direction width WY1 of the fine pattern HP1. The maximum width WM2 of the peripheral pattern PP is larger than the maximum width WM1 of the fine pattern HP1.

In the device region 1a11, a plurality of fine patterns HP1 is arranged in a staggered manner (checkerboard pattern). A first column (in the X-direction) of fine patterns HP1 are arranged at an arrangement pitch of 2×WX1, and a second column (in the X-direction) of fine patterns HP1 are also arranged at an arrangement pitch of 2×WX1, but shifted in position by WX1 in the X-direction relative to the first column. This pattern of columns is repeated along the Y-direction.

In the device region 1a11, island-shaped patterns IP1 are arranged in a staggered manner. A third column of island-shaped patterns IP1 arranged at an arrangement pitch of 2×WX1, but at a position shifted by WX1 in the X-direction relative to the fine patterns HP1 and a fourth column of island-shaped patterns IP1 also arranged at an arrangement pitch of 2×WX1, but shifted in position by WX1 in the X-direction relative to the third column are alternately arranged in a repetitive manner at an arrangement pitch of WY1 along the Y-direction.

In FIG. 2, the fine patterns HP1 are illustrated as having no hatching, and the island-shaped patterns IP1 are illustrated as having a hatching of oblique lines. In the device region 1a11, the main pattern MP has a plurality of fine patterns HP1 arranged in a staggered manner therein.

In the opening regions 1a13, where the peripheral pattern PP is located, a plurality of fine patterns HP2 is located therein for the peripheral pattern PP. Each fine pattern HP2 is equivalent in function to a fine pattern HP1. Thus, the peripheral pattern PP may be configured with an aggregation of fine patterns HP2. In the opening regions 1a13, the fine patterns HP2 are arranged in a staggered manner. The dimension of the fine pattern HP2 may be approximately equal to the dimension of the fine pattern HP1. The X-direction width of the fine pattern HP2 is denoted by WX1' (WX1'≈WX1), and the Y-direction width thereof is denoted by WY1' (WX1'≈WY1). A fifth column (in the X-direction) of fine patterns HP2 is arranged at an arrangement pitch of 2×WX1', and a sixth column (in the X-direction) of fine patterns HP2 is arranged at an arrangement pitch of 2×WX1', but shifted in position by WX1' in the X-direction relative to the fifth column. The pattern of fifth and sixth column is repeated along the Y-direction.

In the opening region 1a13, island-shaped patterns IP2 are arranged in a staggered manner. A seventh column (in the X-direction) of island-shaped patterns IP2 is arranged at an arrangement pitch of 2×WX1' at a position shifted by WX1' in the X-direction relative to the fine patterns HP2, and an eighth column (in the X-direction) of island-shaped patterns IP2 is arranged at an arrangement pitch of 2×WX1' at a position shifted by WX1' in the X-direction relative to the seventh column. This pattern of sixth and seventh columns is repeated an arrangement pitch of WY1' along the Y-direction.

In FIG. 2, the fine patterns HP2 are illustrated as having no hatching, and the island-shaped patterns IP2 are illustrated as having a hatching of oblique lines.

As illustrated in FIG. 3, the reflective mask 1 includes a substrate 10, a multi-layer reflection layer 20, and an absorber film 30 which are stacked in this order along the Z-direction. A portion of the reflective mask 1 corresponding to the device region 1a11 in the multi-layer reflection layer 20 is configured with multi-layer film structures 20a and 20b, which are different in the number of layers therein. FIG. 3 is an enlarged cross-sectional view illustrating a configuration of the reflective mask 1 as a cross-section created by cutting the plan view of FIG. 2 along line B-B.

In the device region 1a11, an aggregation of a plurality of fine patterns HP1 (in other words, the main pattern MP) having a desired periodicity is configured by, at least, alternately locating the multi-layer film 20a and the multi-layer film 20b in a repetitive manner in planar direction. The multi-layer film 20b is smaller in the number of layers thereof than the multi-layer film 20a. The multi-layer film 20a and the multi-layer film 20b are both mounted on the substrate 10 and are alternately located in a repetitive manner in planar direction along the surface of the substrate 10.

The multi-layer film 20a corresponds to the island-shaped pattern IP1, and the multi-layer film 20b corresponds to the hole pattern HP1. Thus, the multi-layer films 20a are arranged in a staggered manner in XY plane view. The multi-layer films 20b are arranged in a staggered manner in XY plane view from positions shifting by a half cycle in the X-direction and a half cycle in the Y-direction of the staggered arrangement pitch relative to the multi-layer films 20a.

Accordingly, the dimension in the XY plane direction of the multi-layer film 20a and the dimension in the XY plane direction of the multi-layer film 20b are equal to each other. The dimension in the X-direction of the multi-layer film 20a and the dimension in the X-direction of the multi-layer film 20b are equal to each other. The dimension in the Y-direction of the multi-layer film 20a and the dimension in the Y-direction of the multi-layer film 20b are equal to each other. The maximum dimension in the XY plane of the multi-layer film 20a and the maximum dimension in the XY plane of the multi-layer film 20b are equal to each other.

Moreover, with regard to a pattern of the device region 1a11 formed from the multi-layer films 20a and 20b, the pattern cycle of the fine patterns HP1 on the reflective mask 1 is approximately twice the pattern cycle (e.g., converted in terms of magnification) of fine patterns on a substrate targeted for exposure.

Furthermore, the dimension of the fine pattern HP1 in the XY plane may be changed according to the arrangement pitch in the XY plane of patterns to be transferred to a substrate targeted for exposure.

The multi-layer film 20a illustrated in FIG. 3 includes a plurality of films 21, a plurality of films 22, a capping film 23, a plurality of films 24, a plurality of films 25, and a capping film 26.

The films 21 and the films 22 are alternately stacked one by one in a repetitive manner on the substrate 10. The film 21 and the film 22 are different in refractive index from each other. The interface between the film 21 and the film 22 can serve as a reflection surface. The film 21 may be formed from a material which contains molybdenum (Mo) as a major component. The film 22 may be formed from a material which contains silicon (Si) as a major component. A multiple reflection structure 27 is configured with a multi-layer structure having the films 21 and the films 22 stacked one by one in a repetitive manner. The capping film 23 is a film used to prevent the multi-layer film 20b from becoming deteriorated by, for example, a cleaning process, and mainly covers the surface of the uppermost film (in FIG.

3, the film 21) in the multi-layer stack. The capping film 23 may be formed from a material which contains ruthenium (Ru) as a major component.

The films 24 and the films 25 are alternately stacked one by one in a repetitive manner on the capping film 23. The film 24 and the film 25 are different in refractive index from each other. The interface between the film 24 and the film 25 can serve as a reflection surface. The film 24 may be formed from a material which contains molybdenum (Mo) as a major component. The film 25 may be formed from a material which contains silicon (Si) as a major component. A multiple reflection structure 28 is formed by the multi-layer structure of the stacked films 24 and the films 25. The capping film 26 is a film used to prevent the multi-layer film 20a from becoming deteriorated by, for example, a cleaning process, and mainly covers the surface of the uppermost film (in FIG. 3, the film 25) in a multi-layer stack of films 24 and the films 25. The capping film 26 may be formed from a material which contains ruthenium (Ru) as a major component.

The multi-layer film 20b includes a plurality of films 21, a plurality of films 22, and a capping film 23. Configurations of the respective films are similar to those of the films 21, the films 22, and the capping film 23 in the multi-layer film 20a.

Furthermore, the Z-direction height of the capping film 23 from the substrate 10 in the multi-layer film 20b may be approximately equal to the Z-direction height of the capping film 23 from the substrate 10 in the multi-layer film 2a.

The multi-layer film 20b does not include any films 24, films 25, and the capping film 26, and, accordingly, is smaller in the number of layers thereof than the multi-layer film 20a. It is desirable that the difference in the number of layers between multi-layer films 20a and 20b be set in such a way as to enable sufficiently attaining a phase shift effect using EUVL. For example, the difference in the number of layers between multi-layer films 20a and 20b may be adjusted in such a manner that a phase difference between the phase of light reflected from the surface of the multi-layer film 20a and the phase of light reflected from the surface of the multi-layer film 20b becomes almost 180°.

In the peripheral region 1a12, the peripheral pattern PP is configured with an aggregate of fine patterns HP2 in a manner similar to the fine pattern HP1 in the device region 1a11. Thus, the peripheral pattern PP includes alternately multi-layer films 20c and a multi-layer films 20d in a repetitive manner in planar direction. The multi-layer film 20d is smaller in the number of layers thereof than the multi-layer film 20c. The multi-layer film 20c and the multi-layer film 20d are both mounted on the substrate 10 and are alternately located in a repetitive manner in planar direction along the surface of the substrate 10.

The multi-layer film 20c corresponds to the island-shaped pattern IP2 (see FIG. 2), and the multi-layer film 20d corresponds to the hole pattern HP2. Thus, the multi-layer films 20c are arranged in a staggered manner in XY plane view. The multi-layer films 20d are arranged in a staggered manner in XY plane view shifted by a half cycle in the X-direction and a half cycle in the Y-direction of the staggered arrangement pitch relative to the multi-layer films 20c.

Accordingly, the dimension in the XY plane direction of the multi-layer film 20c and the dimension in the XY plane direction of the multi-layer film 20d are equal to each other. The dimension in the X-direction of the multi-layer film 20c and the dimension in the X-direction of the multi-layer film 20d are equal to each other. The dimension in the Y-direction of the multi-layer film 20c and the dimension in the Y-direction of the multi-layer film 20d are equal to each other. The maximum dimension in the XY plane of the multi-layer film 20c and the maximum dimension in the XY plane of the multi-layer film 20d are equal to each other.

The dimension of each of the multi-layer films 20c and 20d in the XY plane may be changed according to the arrangement pitch in the XY plane of patterns to be transferred to a substrate targeted for exposure.

The multi-layer film 20c illustrated in FIG. 3 includes a plurality of films 21, a plurality of films 22, a capping film 23, a plurality of films 24, a plurality of films 25, and a capping film 26.

The films 21 and the films 22 are alternately stacked one by one in a repetitive manner on the substrate 10. The film 21 and the film 22 are different in refractive index from each other. The film 21 may be formed from a material which contains molybdenum (Mo) as a major component. The film 22 may be formed from a material which contains silicon (Si) as a major component. The capping film 23 is a film used to prevent or reduce the multi-layer film 20d from becoming deteriorated by, for example, a cleaning process, and mainly covers the surface of the uppermost film (in FIG. 3, the film 21) in a multi-layer structure having the films 21 and the films 22 stacked one by one in a repetitive manner. The capping film 23 may be formed from a material which contains ruthenium (Ru) as a major component.

The films 24 and the films 25 are alternately stacked one by one in a repetitive manner on the capping film 23. The film 24 and the film 25 are different in refractive index from each other. The film 24 may be formed from a material which contains molybdenum (Mo) as a major component. The film 25 may be formed from a material which contains silicon (Si) as a major component. The capping film 26 is a film used to prevent or reduce the multi-layer film 20c from becoming deteriorated by, for example, a cleaning process, and mainly covers the surface of the uppermost film (in FIG. 3, the film 25) in a multi-layer structure having the films 24 and the films 25 stacked one by one in a repetitive manner. The capping film 26 may be formed from a material which contains ruthenium (Ru) as a major component.

The multi-layer film 20d includes a plurality of films 21, a plurality of films 22, and a capping film 23. Configurations of the respective films are similar to those of the films 21, the films 22, and the capping film 23 in the multi-layer film 20c.

Furthermore, the Z-direction height of the capping film 23 from the substrate 10 in the multi-layer film 20d may be approximately equal to the Z-direction height of the capping film 23 from the substrate 10 in the multi-layer film 20c.

Moreover, the multi-layer film 20d does not include any films 24, films 25, and the capping film 26, and, accordingly, is smaller in the number of layers thereof than the multi-layer film 20c. It is desirable that the difference in the number of layers between multi-layer films 20c and 20d be set in such a way as to enable sufficiently attaining a phase shift effect using EUVL. For example, the difference in the number of layers between multi-layer films 20c and 20d may be adjusted (for example, to 13 layers) in such a manner that a phase difference between the phase of light reflected from the surface of the multi-layer film 20c and the phase of light reflected from the surface of the multi-layer film 20d becomes almost 180°.

Next, a method for manufacturing the reflective mask 1 is described with reference to FIGS. 4A, 4B, 4C, and 4D. FIGS. 4A to 4D are cross-sectional views illustrating the method for manufacturing the reflective mask 1. The method for manufacturing illustrated in FIGS. 4A to 4D are merely an example, and the method for manufacturing the reflective mask 1 is not limited to the illustrated method for manufacturing.

A substrate for use in an EUV mask is made from glass which is extremely low in coefficient of thermal expansion, and is in the shape of, for example, a square plate. As viewed from the Z-direction, each side length of the substrate 10 is about 100 millimeters (mm) to 200 mm. As viewed from the Z-direction, the central portion of the substrate 10 has an exposure region (that is, the transfer region 1$a$1) set therein. In XY plane view, the exposure region (the transfer region 1$a$1) is in the shape of a rectangle (see FIG. 1), and each side length of the exposure region is, for example, 120 to 130 mm.

Figure 4A:
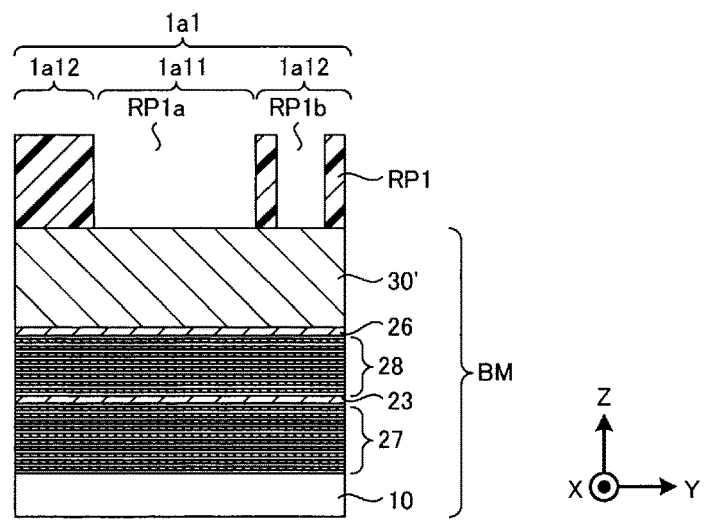
FIGS. 4A, 4B, 4C, and 4D are cross-sectional views illustrating aspects of a method for manufacturing a reflective mask according to a first embodiment.

For the process illustrated in FIG. 4A, a blank member BM for the reflective mask 1 (e.g., an EUV mask) is first produced. Specifically, a substrate 10 made from glass with an extremely low coefficient of thermal expansion is used, and films 21 and films 22 (see FIG. 3) are alternately formed one by one on the substrate 10 using, for example, a sputtering method. This process forms a multiple reflection structure (a reflective layer stack). The film 21 and the film 22 are formed from materials which are different in refractive index from each other. The film 21 may be formed from a material which contains molybdenum (Mo) as a major component. The film 22 may be formed from a material which contains silicon (Si) as a major component. The number of stacked films 21 and the number of stacked films 22 may be about 40 apiece, for example. The uppermost film in the stack may be the film 22. A capping film 23 is deposited on the multiple reflection structure 27 using, for example, a sputtering method. The capping film 23 may be formed from a material which contains ruthenium (Ru) or chromium (Cr) as a major component.

Next, films 24 and films 25 (see FIG. 3) are alternately deposited one by one on the capping film 23 using, for example, a sputtering method. This forms a multiple reflection structure 28 (reflective layer stack). The multiple reflection structure 28 is formed with a sufficient number of stacked films as to enable a phase shift effect to be obtained via later processing. For example, the multiple reflection structure 28 includes thirteen (13) stacked films 24 and 25 apiece. The film 24 and the film 25 may be formed from materials which are different in refractive index from each other. The film 24 may be formed from a material which contains molybdenum (Mo) as a major component. The film 25 may be formed from a material which contains silicon (Si) as a major component. The number of the stacked films 24 and the number of the stacked films 25 may be, for example, about 13 each. The uppermost film in the stack may be the film 25. A capping film 26 is deposited on the multiple reflection structure 28 using, for example, a sputtering method. The capping film 26 may be formed from a material which contains ruthenium (Ru) or chromium (Cr) as a major component.

Furthermore, the capping film 23 may be deposited between the multiple reflection structure 27 and the multiple reflection structure 28 to a thickness of several nanometers (nm). The capping film 23 may serve as a stopper layer during fabrication/patterning of the multiple reflection structure 28.

Next, an absorber film 30' is formed on the capping film 26. The absorber film 30' may be formed from a material which contains, as a major component, a material which is high in absorbance (in other words, low in reflectance) with respect to the exposure light (for example, Ta, TaN, or TaBOx). Furthermore, a hard mask may be formed on the absorber film 30' in some examples. The hard mask is of a material which allows etching selectivity for the absorber film 30' to be allocated to another material (for example, silicon nitride (SiN) or tantalum oxide (TaO)). By this method, a blank member BM is produced.

Next, a resist pattern RP1 is formed on the blank member BM. Specifically, a chemically amplified resist, for example, is applied to the upper surface of the blank member BM. The applied resist may be a main-chain scission type resist instead of a chemically amplified resist in some examples. The resist may be a positive tone type resist or a negative tone type resist.

Next, a first drawing (patterning) using an electron-beam lithography apparatus is performed. The resist film is selectively irradiated with an electron beam and thus draws latent images corresponding to opening patterns RP1$a$ and RP1$b$, corresponding to the main pattern MP and the peripheral pattern PP. Next, post exposure bake (PEB) processing is performed as needed and the latent images are developed using alkali aqueous or organic solvent, depending on the type of the resist. In the case of a positive tone resist, the portion irradiated with an electron beam will be removed in the development. In the case of a negative tone resist, the portions other than the irradiated portion are removed in the development. This leads to a formation of a resist pattern RP1 having opening patterns RP1$a$ and RP1$b$.

The transfer region 1$a$1 is conceptually divided into a device region 1$a$11, in which the main pattern MP is provided, and a peripheral region 1$a$12, which is located around the device region 1$a$11. The peripheral region 1$a$12 contains therein opening regions 1$a$13, in which peripheral patterns PP required for, for example, accuracy measurement and alignment are provided. In the resist pattern RP1, the opening pattern RP1$a$ corresponds to the device region 1$a$11, and the opening pattern RP1$b$ corresponds to the opening region 1$a$13.

Figure 4B:
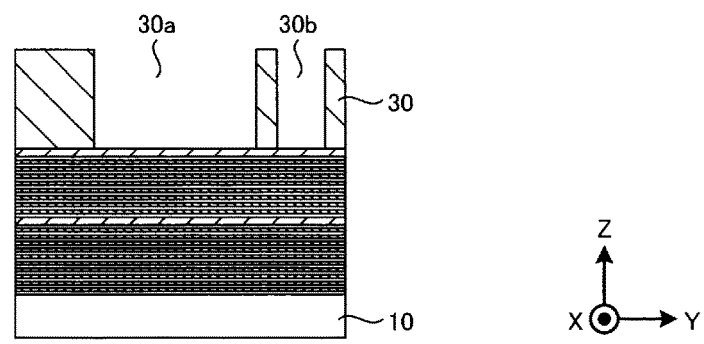

In the process illustrated in FIG. 4B, the patterning on the absorber film 30 is performed using the resist pattern RP1. While a method of first forming the peripheral pattern PP and then forming the main pattern MP is described as an example, in other examples the main pattern MP may be formed first. As such, the sequential order of these operations for forming is not a limitation.

Specifically, plasma etching is performed on the absorber film 30 with the resist pattern RP1 used as a mask. This leads to a transfer of the pattern of the resist pattern RP1 to the absorber film 30. A hard mask can be used between the resist pattern RP1 and the absorber film 30, in such a process the pattern of the resist pattern RP1 is first transferred to the hard mask, then the patterned hard mask is used as a mask for the transfer of the pattern to the absorber film 30. In any event, the opening patterns 30$a$ and 30$b$ corresponding to the opening patterns RP1$a$ and RP1$b$ are formed in the absorber film 30. Subsequently, any remaining resist pattern and/or hard mask is removed with use of plasma etching or a wet etching processing.

Figure 4C:
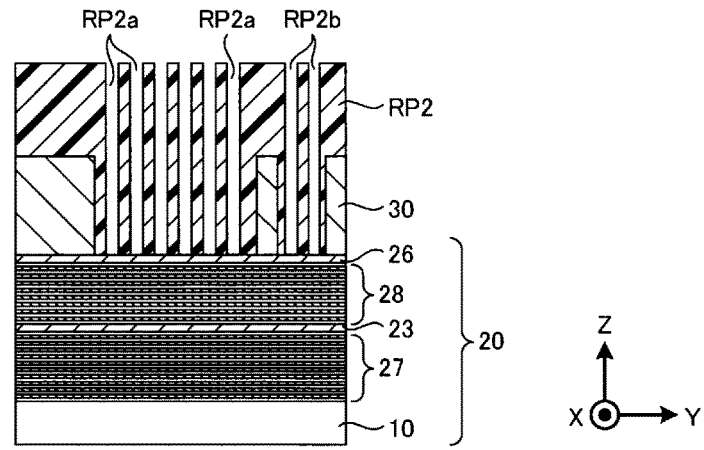

In the process illustrated in FIG. 4C, a second resist is applied to the substrate having the absorber film 30 already having the opening patterns 30$a$ and 30$b$ formed therein. With regard to the type of the second resist, it is desirable that a chemically amplified resist or a main-chain scission type resist be used. Acyclic, repeating pattern (in which the pitch thereof becomes ½ of that on the mask when transferred to a substrate at a desired magnification) is formed on portions corresponding to the device region 1$a$11 and the opening regions 1$a$13 in the resist film, in other words, portions covering the opening patterns 30$a$ and 30$b$.

For example, in XY plane view, the cyclic pattern may include a staggered arrangement of opening patterns RP2a. This staggered arrangement generally corresponds to the staggered arrangement (see FIG. 2) of fine patterns HP1 in the device region 1a11. The X-direction width of each opening pattern RP2a is denoted by WX1, and the Y-direction width thereof is denoted by WY1. A first column (along the X-direction) of opening patterns RP2a has an arrangement pitch of 2×WX1 and a second column of opening patterns RP2a also has an arrangement pitch of 2×WX1, but this is from a position shifted by a distance WX1 in the X-direction relative to the first column. This pattern is repeated along the Y-direction.

The pattern pitch of the staggered arrangement of opening patterns RP2a is approximately twice the pattern pitch of the pattern formed on the substrate by an exposure using the final mask formed by this process. Thus, the ratio of the width of the opening pattern RP2a to the arrangement pitch distance is approximately twice the ratio of the width the pattern features formed with the mask to the arrangement pitch distance the patterns formed with the mask.

In XY plane view, a staggered arrangement of opening patterns RP2b corresponding to the staggered arrangement (see FIG. 2) of fine patterns HP2 in the opening region 1a13 may also be included. In some examples, the dimension of the opening pattern RP2b may be approximately equal to the dimension of the opening pattern RP2a. The X-direction width of the opening pattern RP2b is denoted by WX1' (WX1'≈WX1), and the Y-direction width thereof is denoted by WY1' (WX1'≈WY1). A fifth column in the X-direction of opening patterns RP2b has an arrangement pitch of 2×WX1' and a sixth column in the X-direction of opening patterns RP2b also has an arrangement pitch of 2×WX1' but is shifted in position by WX1' in the X-direction relative to the fifth column. This is repeated along the Y-direction.

After performing PEB processing as needed, a resist pattern RP2 having a periodic structure of a plurality of opening patterns RP2a in the region of the opening pattern 30a (the device region 1a11) and having a periodic structure of a plurality of opening patterns RP2b in the region of the opening pattern 30b (the opening region 1a13) is formed by development.

Figure 4D:
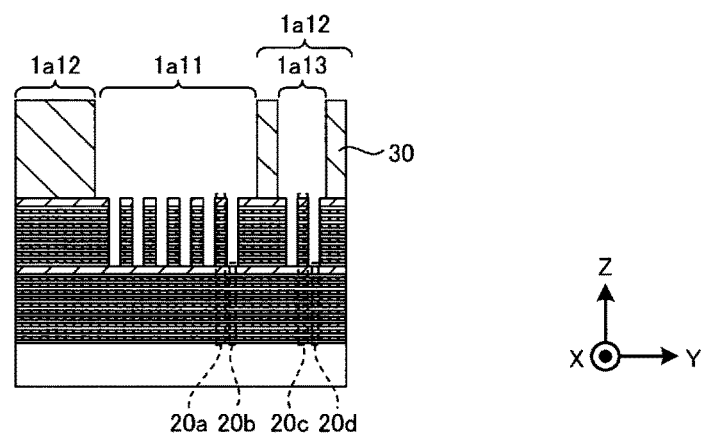

In the process illustrated in FIG. 4D, plasma etching is applied to the capping film 26 and the multiple reflection structure 28 with the resist pattern RP2 having periodic structures used as a mask. With this plasma etching, upper portions of the multi-layer reflection layer 20 are removed at regions exposed by the opening patterns RP2a, so that multi-layer films 20b are formed, and upper portions of the multi-layer reflection layer 20 are not removed at regions not exposed by the opening patterns RP2a, so that multi-layer films 20a are left. In the region of the opening pattern 30b (the opening region 1a13), upper portions of the multi-layer reflection layer 20 are removed at regions exposed by the opening patterns RP2b, so that multi-layer films 20d are formed, and upper portions of the multi-layer reflection layer 20 are not removed at regions not exposed by the opening patterns RP2b, so that multi-layer films 20c are left.

This provides a reflective mask 1 including a multi-layer reflection layer 20 having a periodic structure in which the multi-layer films 20a and the multi-layer films 20b are alternately repeated one by one in planar direction in the device region 1a11 and having a periodic structure in which the multi-layer films 20c and the multi-layer films 20d are alternately repeated one by one in planar direction in the opening region 1a13.

Furthermore, before, after, or between the above-mentioned processes, a cleaning process (or processes) may be added as appropriate to protect a mask from contamination, or similarly a measurement (metrology) process (or processes) may be added between or after various process steps.

As described above, in the first embodiment, with regard to the reflective mask 1, the multi-layer reflection layer 20 is configured in such a manner that the appropriate exposure dose for the device region 1a11 and the appropriate exposure dose for the peripheral region 1a12 become equal to each other or approximately so. For example, in the multi-layer reflection layer 20, a periodic structure in which the multi-layer films 20a and the multi-layer films 20b are alternately repeated one by one in planar direction is located in the device region 1a11 and a periodic structure in which the multi-layer films 20c and the multi-layer films 20d are alternately repeated one by one in planar direction is located in the opening region 1a13 contained in the peripheral region 1a12. This enables the reflective mask 1 to have a phase shift performance and also enables the reflective mask 1 to have a structure which allows batch exposure of both the device region 1a11 and the peripheral region 1a12 with respect to the multi-layer reflection layer 20. Accordingly, throughput of exposure processing of a substrate using the reflective mask 1 can be improved.

Furthermore, a plurality of fine patterns HP1, such as a plurality of hole patterns illustrated as an example in FIG. 1 and FIG. 2, may be applied to the formation of memory holes of a three-dimensional memory. Moreover, in the device region 1a11 of the reflective mask 1, a plurality of line-and-space patterns may be formed instead of a plurality of hole patterns.

In FIG. 3, a configuration in which the capping film 26 covers the +Z-direction side surface of the multiple reflection structure 28 is illustrated as an example, but the capping film 26 may also cover a lateral-side surface (for example, the +X-direction side surface, the −X-direction side surface, the +Y-direction side surface, and/or the −Y-direction side surface) of the multiple reflection structure 28.

Figure 5:
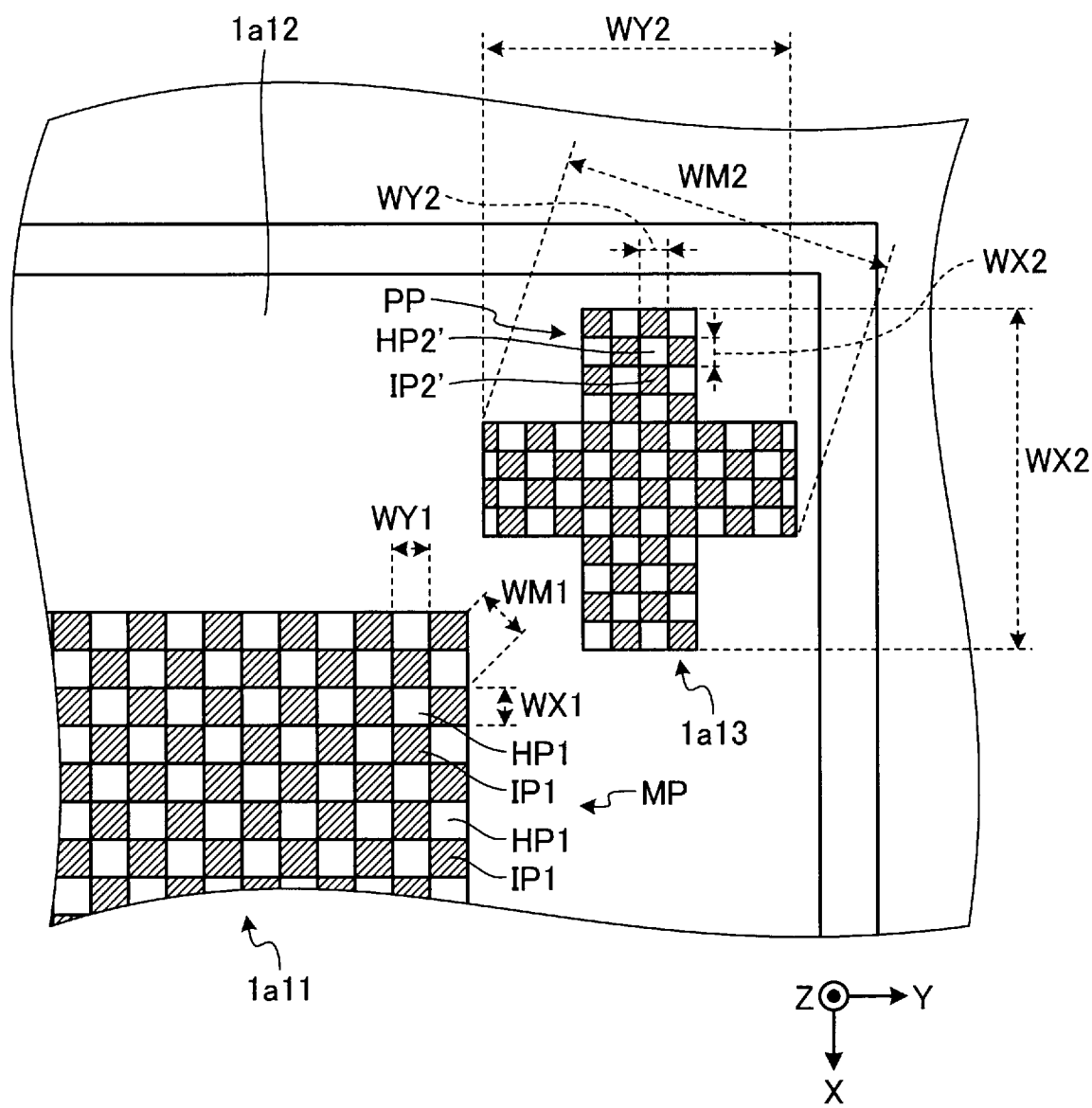
FIG. 5 is an enlarged plan view illustrating a configuration of a reflective mask according to a modification of a first embodiment.

As illustrated in FIG. 5, with regard to the reflective mask 1, a multi-layer film with repetition of fine patterns is in the opening region 1a13. With these fine patterns, the shape of each is similar to, but with a dimension that is different from the fine patterns in the device region 1a11. FIG. 5 is an enlarged plan view illustrating a structure of the reflective mask 1 according to a modification example of the first embodiment. In this modification example, the interior of an opening region 1a13 (formed by removing the absorber film 30) of the peripheral pattern PP is filled with multi-layer films 20c and multi-layer films 20d, the pitch of which differs from that in the main pattern MP.

In this depicted case, the cross-shaped boundary between adjacent multi-layer films 20c and multi-layer films 20d is located in such a way as to coincide with the center of the peripheral pattern PP. The dimension and the arrangement of fine patterns in the peripheral pattern PP may be determined in such a manner that the end portion of the peripheral pattern PP (that is, the end portion of the opening region 1a13) and the repetition cycle end of fine patterns overlap with each other. For example, referring to FIG. 5, the fine pattern HP2' and the island-shaped pattern IP2' in the opening region 1a13 are similar in shape to the fine pattern HP1 and the island-shaped pattern IP1 in the device region 1a11. However, the dimensions of the fine pattern HP2' and the island-shaped pattern IP2' are respectively smaller than the dimensions of the fine pattern HP1 and the island-shaped pattern IP1. The X-direction width WX2 of fine pattern HP2' is smaller than the X-direction width WX1 of the fine pattern HP1. The Y-direction width WY2 of fine pattern HP2' is smaller than the Y-direction width WY1 of the fine pattern HP1. A case in which the dimension in the X-direction of the fine pattern HP2' is about 1/16 of the dimension in the X-direction of the peripheral pattern PP and the dimension in the Y-direction of the fine pattern HP2' is about 1/16 of the dimension in the Y-direction of the peripheral pattern PP is illustrated as an example in FIG. 5. Such a configuration also enables adjusting of the necessary exposure dose for the device region 1a11 and the necessary exposure dose for the peripheral region 1a12 so as to be equal to each other, or approximately so.

Second Embodiment

Next, a reflective mask according to a second embodiment is described. The following description focuses on portions different from those in the first embodiment. Moreover, while an EUV mask is described as an example of the reflective mask, the reflective masks of the present disclosure are not limited to an EUV mask.

In the second embodiment, with regard to the reflective mask, the multi-layer reflection layer is configured in such a manner that the reflectance for exposure light of a surface in the device region 1a11 is smaller than the reflectance for exposure light of a surface in the peripheral region 1a12. Accordingly, the multi-layer reflection layer is configured in such a manner that the appropriate exposure dose for the device region 1a11 and the appropriate exposure dose for the opening region 1a13 become approximately equal to each other.

Figure 6:
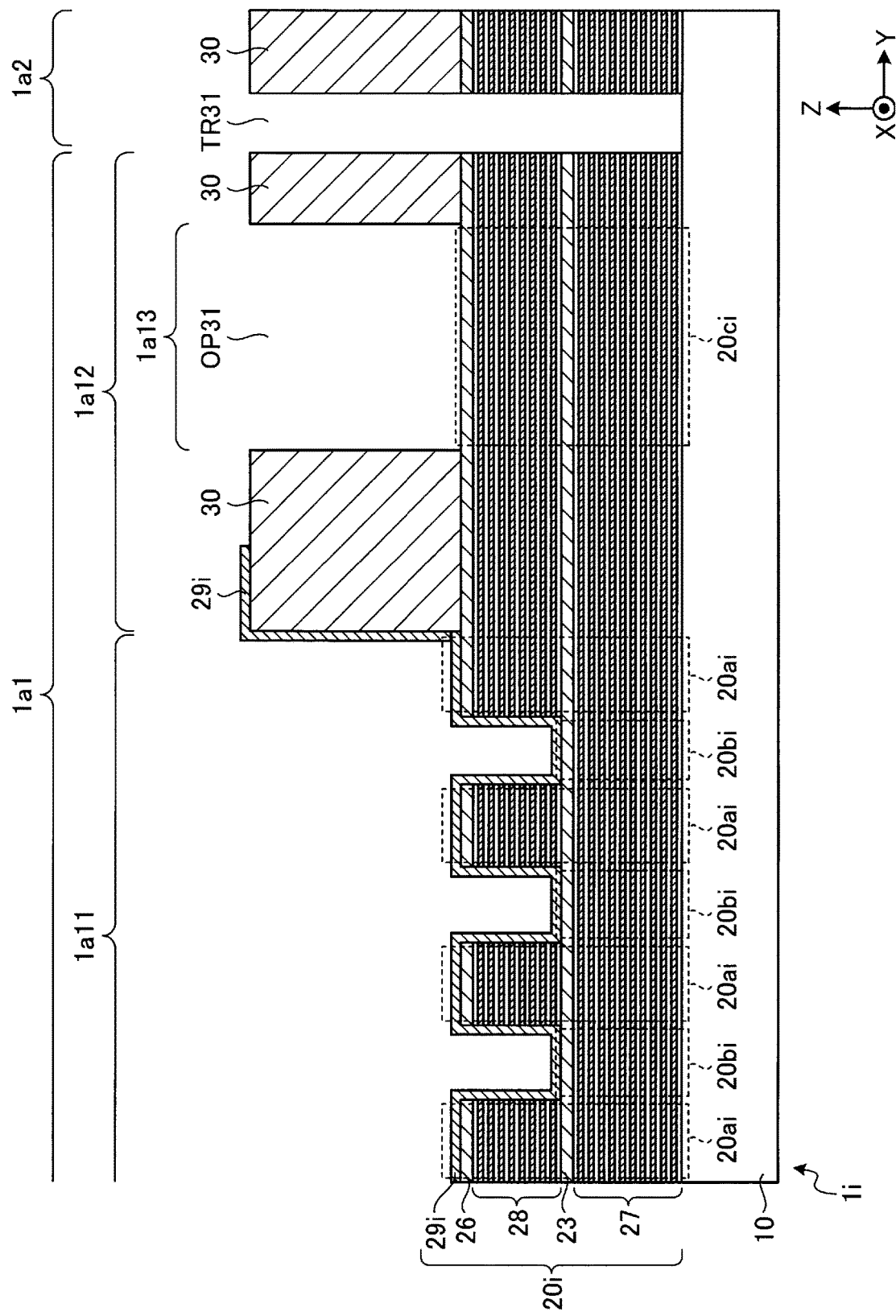
FIG. 6 is an enlarged cross-sectional view illustrating a configuration of a reflective mask according to a second embodiment.

Specifically, a reflective mask 1i can be configured as illustrated in FIG. 6. FIG. 6 is an enlarged cross-sectional view illustrating a configuration of the reflective mask 1i according to the second embodiment, and illustrates a cross-section created by cutting a portion corresponding to line B-B in the reflective mask 1i.

In pattern formation of the peripheral region 1a12 in the reflective mask 1i, the peripheral patterns PP on the reflective mask 1i have a planar shape matching the outer contour of the opening OP31 of the absorber film 30, and the opening region 1a13 has no periodic structure therein.

In the second embodiment, with regard to a multi-layer reflection layer 20i, the surface of the device region 1a11 is covered with a reflection adjustment film 29i, and, in the opening region 1a13, a single (unpatterned) multi-layer film 20ci is located therein, instead of a periodic structure pattern comprising a plurality of multi-layer films 20c and 20d (compare FIG. 3). The reflection adjustment film 29i is a film used to attenuate (slightly reduce) the reflectance of exposure light, and can be referred to as a semi-transparent film in the sense that it is semi-transparent to exposure light. Furthermore, as illustrated in FIG. 6, the surfaces of regions other than the opening region 1a13 and the portions of the peripheral region 1a12 adjacent to the opening region 1a13 may be covered with the reflection adjustment film 29i.

A reflection adjustment film 29i, which is semi-transparent to EUV light, is provided on surfaces of multi-layer films 20ai and multi-layer films 20bi in the device region 1a11. The transmittance for EUV light by the reflection adjustment film 29i may be adjusted in such a manner that the appropriate exposure dose in EUVL for the peripheral pattern PP (in the opening region 1a13) and the appropriate exposure dose for the main pattern MP (in the device region 1a11) become almost equal to each other. The reflection adjustment film 29i is formed from a material that generally slightly reduces reflectance of the exposure light. The material of the reflection adjustment film 29i can be selected from, for example, oxides and nitrides including, for example, Ru, Ta, and Si, but is not limited to these. The material desirably absorbs deep ultraviolet light. Moreover, the film thickness of the reflection adjustment film 29i is desirably less than or equal to 50 nm. The film thicknesses can be set to be appropriate according to the refractive index of the film(s).

Thus, adjusting the material and film thickness of the reflection adjustment film 29i permits adjusting of the appropriate exposure dose for the device region 1a11 to make it closer to (for example, approximately equal to) the appropriate exposure dose for the opening region 1a13.

Moreover, in the second embodiment, as illustrated in FIG. 7A to FIG. 8B, processing which differs in the following points from that in the first embodiment is performed. FIGS. 7A, 7B, and 7C and FIGS. 8A and 8B are cross-sectional views illustrating a method for manufacturing the reflective mask 1i.

Figure 7A:
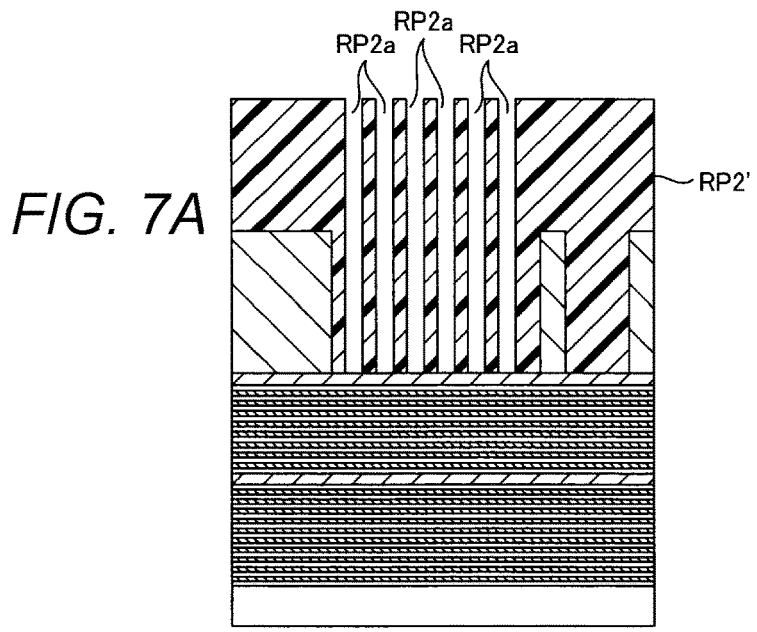
FIGS. 7A, 7B, and 7C are cross-sectional views illustrating aspects of a method for manufacturing a reflective mask according to a second embodiment.

After the process illustrated in FIG. 4A and the process illustrated in FIG. 4B have been performed, the process illustrated in FIG. 7A is performed. In the process illustrated in FIG. 7A, processing similar to that illustrated in FIG. 4C is performed except that no periodic pattern is created in the resist film at a portion corresponding to the opening region 1a13 and a resist pattern RP2' (which does not have a plurality of opening patterns RP2b; compare FIG. 4C) is formed.

Figure 7B:
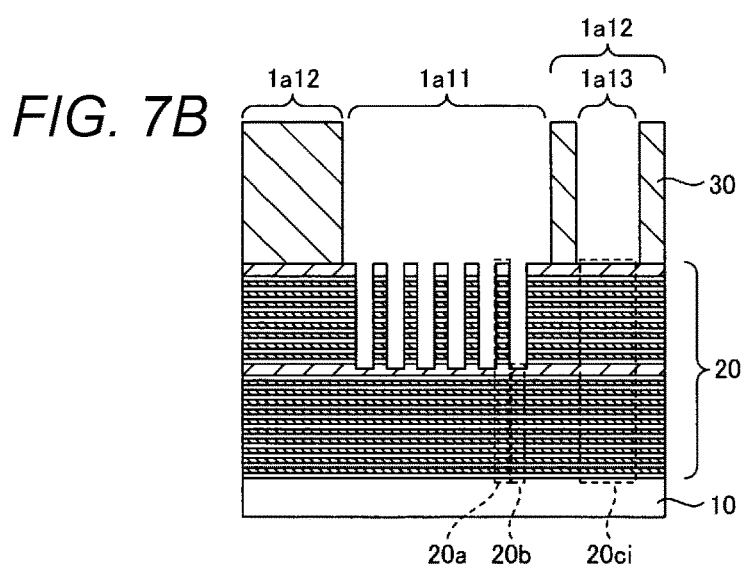

In the process illustrated in FIG. 7B, processing similar to that illustrated in FIG. 4D is performed except that no periodic structure is formed in the opening region 1a13 (in other words, just the unpatterned, single multi-layer film 20ci is left).

Figure 7C:
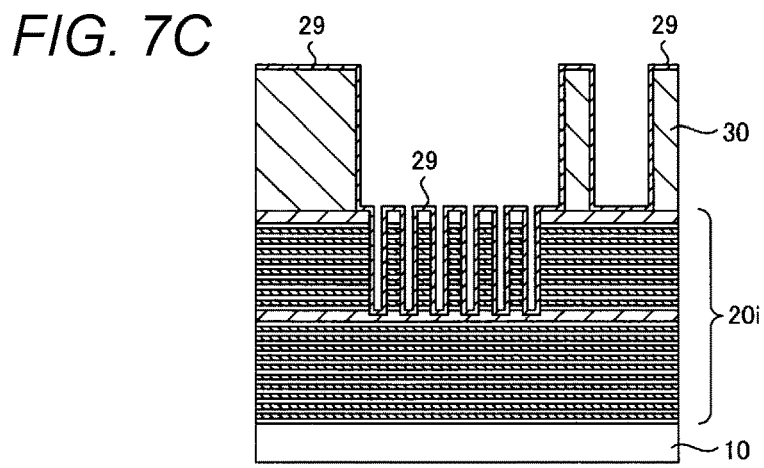

In the process illustrated in FIG. 7C, a reflection adjustment film 29 is deposited (or otherwise formed) entirely covering the multi-layer reflection layer 20i and the absorber film 30. The material of the reflection adjustment film 29 can be selected from, for example, oxides and nitrides including, for example, Ru, Ta, and Si, but is not limited to these. The material is desirably a material which also absorbs deep ultraviolet light. The film thickness of the reflection adjustment film 29 is desirably less than or equal to 50 nm. Examples of the film formation method include depositing ruthenium or chromium to a film thickness of several nm or less using a sputtering method and forming a silicon oxide film to a film thickness of several nm or less using an atomic layer deposition method (ALD method).

Figure 8A:
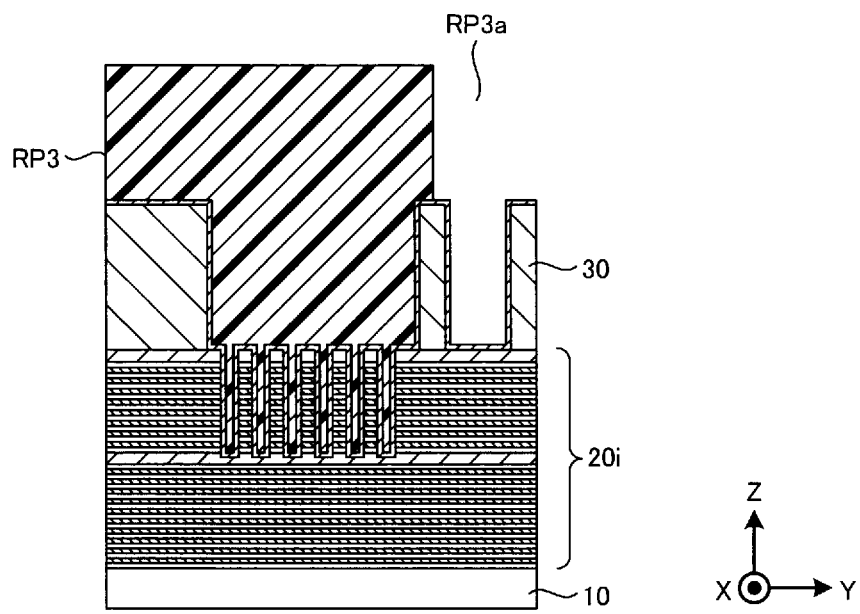
FIGS. 8A and 8B are cross-sectional views illustrating additional aspects of a method for manufacturing a reflective mask according to a second embodiment.

In the process illustrated in FIG. 8A, a third resist is applied to the substrate. The type of the resist to be used is desirably a chemically amplified resist or a main-chain scission type resist which is used in the first drawing and the second drawing. A latent image of an opening pattern RP3a is formed on portions corresponding to the opening region 1a13 and a periphery thereof in the resist film. Next, t PEB processing is performed as needed and the latent image is developed using alkali aqueous or organic solvent depending on the type of the resist utilized. This leads to a formation of a resist pattern RP3 having the opening pattern RP3a.

In FIG. 8A, a case where the opening pattern RP3a exposes the opening region 1a13 and the vicinity thereof is illustrated as one example. In other examples, the opening pattern RP3a may expose the entire peripheral region 1a12.

Figure 8B:
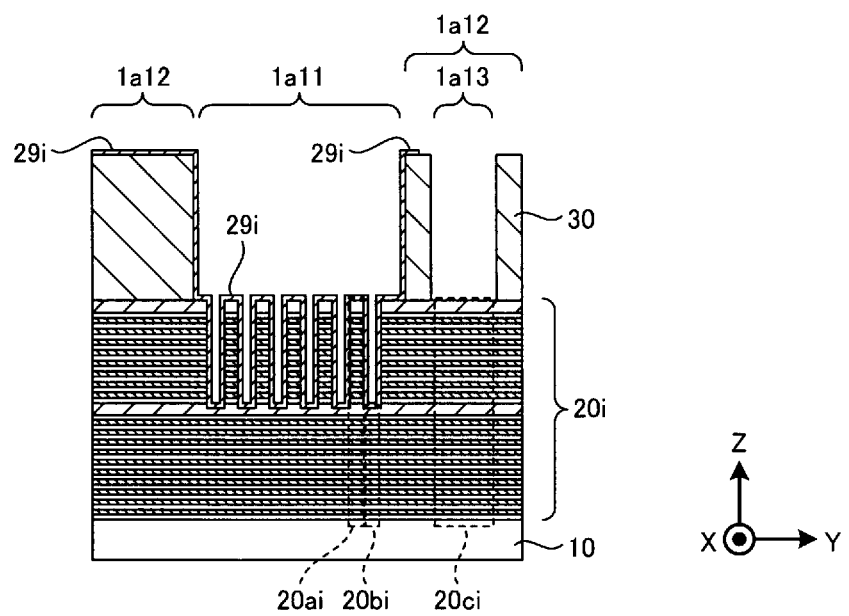

In the process illustrated in FIG. 8B, patterning of the reflection adjustment film 29i is performed using the resist pattern RP3. While protecting the device region 1a11 in performing such patterning, the reflection adjustment film 29i in the opening region 1a13 and the periphery thereof is removed using, for example, a plasma etching method, and, then the resist is removed.

This provides a reflective mask 1i in which a periodic structure having the multi-layer films 20ai and the multi-layer films 20bi alternately repeated in planar direction is provided in the device region 1a11 and the surface of the multi-layer reflection layer 20i is covered with the reflection adjustment film 29i in the device region 1a11.

As described above, according to the second embodiment, in the reflective mask 1i, the multi-layer reflection layer 20i is configured in such a manner that the reflectance for exposure light of the surface in the device region 1a11 is smaller than the reflectance for exposure light of the surface in the opening region 1a13. For example, in the multi-layer reflection layer 20i, mainly the surface of the device region 1a11 is covered with the reflection adjustment film 29i. This enables configuring the multi-layer reflection layer 20i in such a manner that the appropriate exposure dose for the device region 1a11 and the appropriate exposure dose for the peripheral region 1a12 become equal to each other.

Third Embodiment

Next, a reflective mask according to a third embodiment is described. The following description focuses on portions different from those in the first embodiment and the second embodiment. Moreover, while an EUV mask is described as an example of the reflective mask, the reflective mask is not limited to an EUV mask.

In the third embodiment, with regard to the reflective mask, the multi-layer reflection layer is configured in such a manner that the number of layers of each multi-layer film in the device region 1a11 is smaller than the number of layers of a multi-layer film in the peripheral region 1a12. Accordingly, the multi-layer reflection layer is configured in such a manner that the appropriate exposure dose for the device region 1a11 and the appropriate exposure dose for the peripheral region 1a12 become equal to each other.

Figure 9:
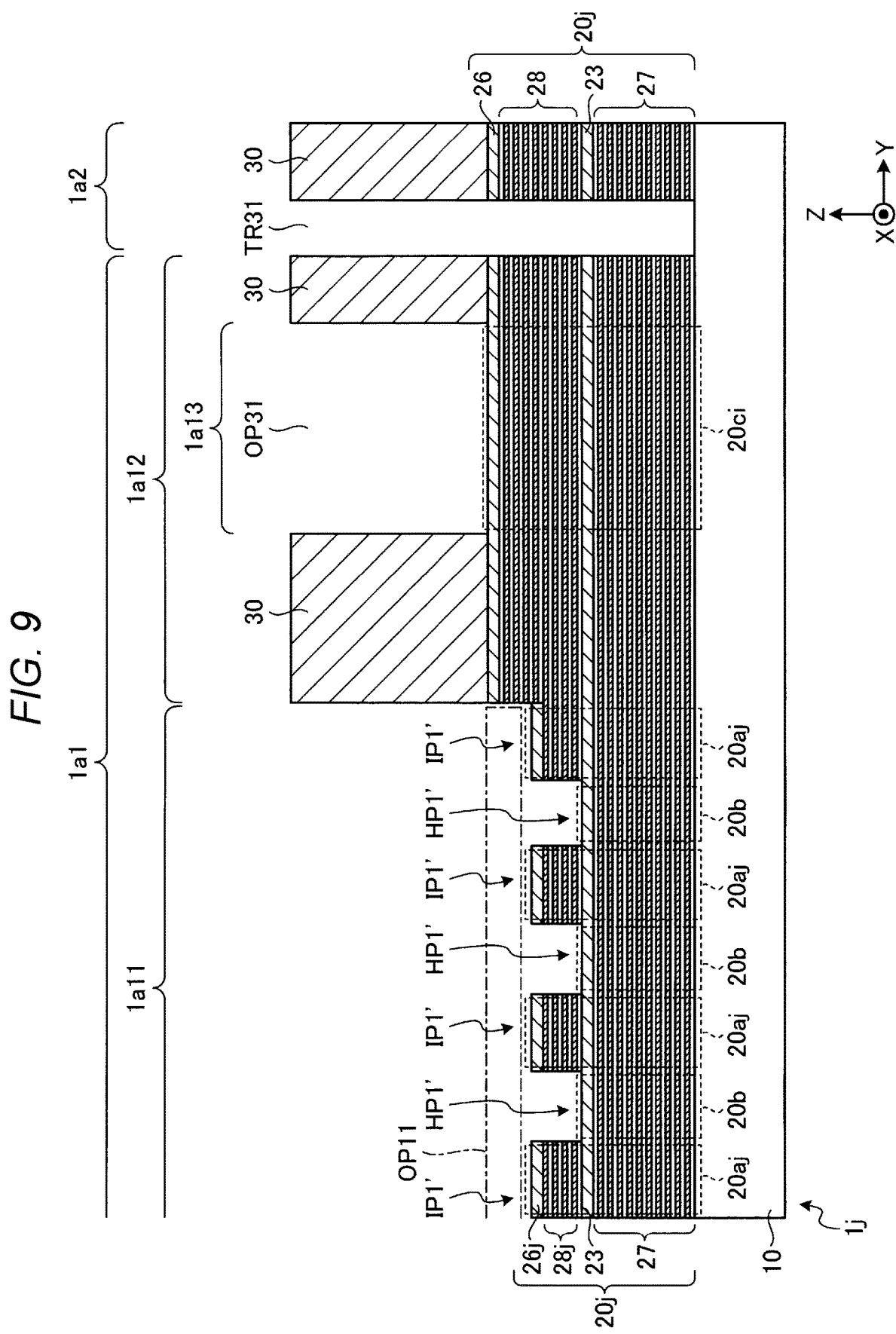
FIG. 9 is an enlarged cross-sectional view illustrating a configuration of a reflective mask according to a third embodiment.

Specifically, a reflective mask 1j may be configured as illustrated in FIG. 9. FIG. 9 is an enlarged cross-sectional view illustrating a configuration of the reflective mask 1j according to the third embodiment, and illustrates a cross-section created by cutting a portion corresponding to line B-B in the reflective mask 1j.

In the third embodiment, with regard to a multi-layer reflection layer 20j, a periodic structure having multi-layer films 20aj and multi-layer film 20b alternately repeated in planar direction is located in the device region 1a11, and a single multi-layer film 20ci is located in the opening region 1a13. The number of layers of each multi-layer film 20aj is smaller than the number of layers of the multi-layer film 20ci.

For example, the multi-layer film 20ci in the opening region 1a13 includes a multiple reflection structure 27, a capping film 23, a multiple reflection structure 28, and a capping film 26 which are stacked in this order. The multi-layer film 20aj in the device region 1a11 includes a multiple reflection structure 27, a capping film 23, a multiple reflection structure 28j, and a capping film 26j which are stacked in this order. The number of layers, (films 24 and films 25), in the multiple reflection structure 28j is less than the number of layers (films 24 and films 25) in the multiple reflection structure 28.

Furthermore, the numbers of layers may be adjusted in such a manner that, with regard to EUV lithography (EUVL), the appropriate exposure dose for the peripheral pattern PP in the opening region 1a13 and the appropriate exposure dose for the main pattern MP in the device region 1a11 become almost equal to each other.

It can be deemed that the multi-layer reflection layer 20j has an opening pattern OP11 which exposes the device region 1a11 and that the island-shaped patterns IP1' and hole patterns HP1' are arranged at the bottom of the opening pattern OP11 at a pitch cycle similar to that in the first embodiment. The island-shaped pattern IP1' is lower in the height in the Z-direction than the island-shaped pattern IP1 (see FIG. 3) in the first embodiment, and the hole pattern HP1' is shallower in the depth in the Z-direction than the hole pattern HP1 in the first embodiment.

Figure 10A:
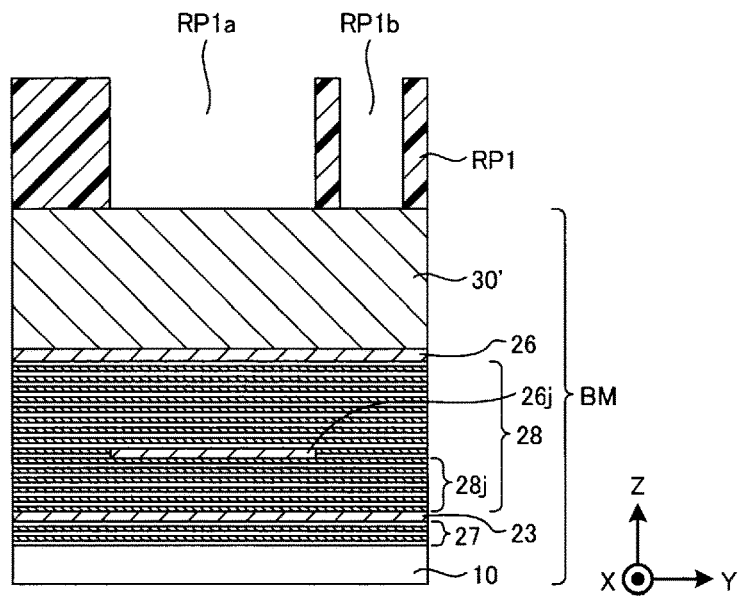
FIGS. 10A, 10B, and 10C are cross-sectional views illustrating aspects of a method for manufacturing a reflective mask according to a third embodiment.
Figure 10B:
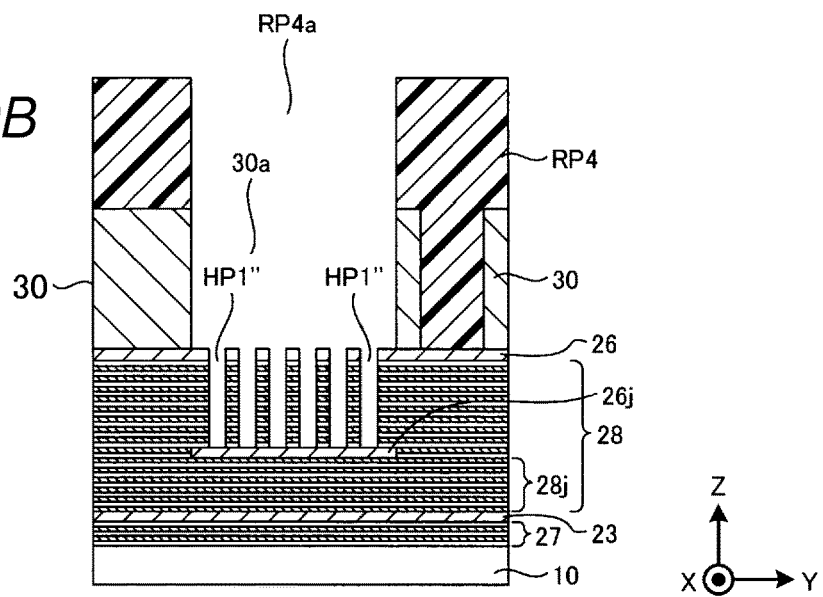
Figure 10C:
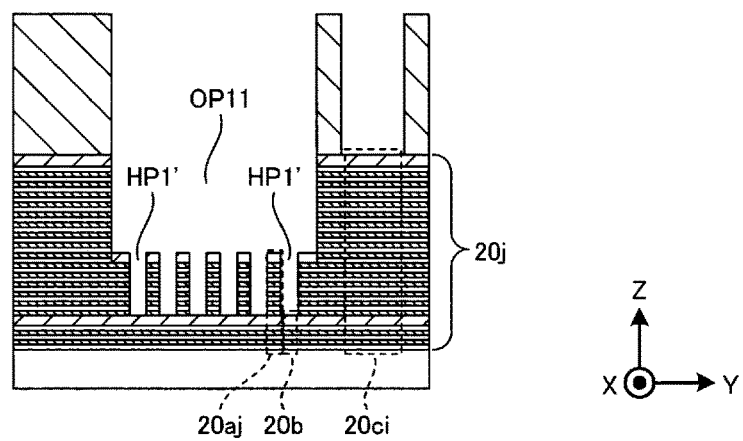

In the third embodiment, as illustrated in FIGS. 10A, 10B, and 10C, processing which differs in the following points from that in the first embodiment is performed. FIGS. 10A to 10C are cross-sectional views illustrating a method for manufacturing the reflective mask 1j.

In a process illustrated in FIG. 10A, processing similar to the process illustrated in FIG. 4A is performed except that a capping film 26j selectively located in the device region 1a11 is formed at a portion between the capping film 23 and the capping film 26 as viewed in the Z-direction.

Then, after the process illustrated in FIG. 10A, the process illustrated in FIG. 7A, and the process illustrated in FIG. 7B have been performed, the process illustrated in FIG. 10B is performed. In the process illustrated in FIG. 10B, a fourth resist is applied to the substrate. With regard to the type of the fourth resist, it is desirable that a chemically amplified resist or a main-chain scission type resist be used. Subsequently, a latent image of an opening pattern RP4a is drawn (or otherwise formed) on portions corresponding to the device region 1a11 in the resist film. Next, PEB processing is performed as needed and the latent image is developed using alkali aqueous or organic solvent depending on the type of the resist. This leads to a formation of a resist pattern RP4 having the opening pattern RP4a. Using the resist pattern RP4, the opening pattern 30a of the absorber film 30 and hole patterns HP1" in a region ranging from the capping film 26 to the capping film 26j to the region ranging from the capping film 26 to the capping film 26j and a region ranging from the capping film 26j to the capping film 23 are transferred. This leads to a formation of an opening pattern OP11, which exposes the device region 1a11, and a plurality of hole patterns HP1' cyclically arranged at the bottom portion of the opening pattern OP11, in the multi-layer reflection layer 20j.

This provides a reflective mask 1j including a multi-layer reflection layer 20j configured in such a manner that the number of layers of each of the multi-layer films 20aj and 20b in the device region 1a11 is less than the number of layers of the multi-layer film 20ci in the peripheral region 1a12 (that is, in opening regions 1a13).

As described above, according to the third embodiment, in the reflective mask 1j, the multi-layer reflection layer 20j is configured in such a manner that the number of layers of each of the multi-layer films 20aj and 20b in the device region 1a11 is less than the number of layers of the multi-layer film 20ci in the peripheral region 1a12 (that is, in the opening regions 1a13). This enables configuring the multi-layer reflection layer 20j in such a manner that the appropriate exposure dose for the device region 1a11 and the appropriate exposure dose for the peripheral region 1a12 (that is, the opening regions 1a13) become equal to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reflective mask, comprising:
a reflection layer including a first region having a plurality of first patterns, a second region surrounding the first region, and a third region within the second region, the reflection layer including a stack of alternating first layers and second layers; and
an absorber film covering the second region and having a second pattern including an opening exposing a portion of the third region.

2. The reflective mask according to claim 1, wherein a plurality of third patterns is in the portion of the third region.

3. The reflective mask according to claim 2, wherein the third patterns each have a planar shape corresponding to a planar shape of the first patterns, but the third patterns each have a size different from a size of the first patterns.

4. The reflective mask according to claim 1, wherein the plurality of first patterns comprise a first multi-layer film structure and a second multi-layer film structure, which is adjacent to the first multi-layer film structure in planar direction and has fewer layers than the first multi-layer film structure.

5. The reflective mask according to claim 4, wherein the second pattern comprises a third multi-layer film structure and a fourth multi-layer film structure, which is adjacent to the third multi-layer film structure in planar direction and has fewer layers than the third multi-layer film structure.

6. The reflective mask according to claim 4, wherein the reflectance of exposure light from the first region is less than reflectance of exposure light from the third region.

7. The reflective mask according to claim 4, wherein the reflection layer is covered with a reflection adjustment film in the first region.

8. The reflective mask according to claim 4, wherein the reflection layer further includes a fourth multi-layer film structure in the second region, and
the number of layers in the second multi-layer film structure is less than the number of layers of the fourth multi-layer film structure.

9. The reflective mask according to claim 1, further comprising:
a trench extending through the absorber film and the reflection layer to the substrate at an outer periphery of the second region.

10. The reflective mask according to claim 1, further comprising:
an attenuating film conformally disposed on the plurality of first patterns in the first region and a peripheral portion of the absorber film in the second region, but not disposed on the third region.

11. The reflective mask according to claim 10, wherein the attenuating film is an oxide or nitride of ruthenium, tantalum, or silicon.

12. The reflective mask according to claim 10, wherein the attenuating film is less than 50 nanometers in thickness.

13. A reflective mask for photolithographic process, the reflective mask comprising:
a substrate having a surface;
a first reflective stack of first type layers alternating with second type layers on the surface of the substrate;
a first cap layer on an upper surface of the reflective stack;
a second reflective stack of third type layers alternating with fourth type layers on an upper surface of the first cap layer;
a plurality of first patterns formed in a first region of the second reflective stack, the plurality of first patterns being formed by removal of portions of the second reflective stack;
an absorber film above a second region of the second reflective stack, the second region surrounding the first region;
an opening in the absorber film exposing a third region of the second reflective stack; and
a plurality of second patterns formed in the third region of the second reflective stack by removal of portions of the second reflective stack.

14. The reflective mask according to claim 13, wherein the opening in absorber film is shaped like an alignment mark.

15. The reflective mask according to claim 14, wherein the first and second patterns are substantially the same dimension as one another.

16. The reflective mask according to claim 14, wherein the first and second patterns are different sizes.

17. The reflective mask according to claim 13, wherein the second reflective stack includes a second cap layer on an upper surface.

18. The reflective mask according to claim 13, further comprising:
an attenuating film conformally disposed on the plurality of first patterns in the first region and a peripheral portion of the absorber film in the second region, but not disposed on the third region.

19. The reflective mask according to claim 13, wherein a maximum height of the first patterns is different than a maximum high of the second patterns.

20. The reflective mask according to claim 13, wherein the plurality of first patterns form a checkerboard pattern in the first region, and
the plurality of second patterns form a checkerboard pattern in the third region.

* * * * *